(12) United States Patent
Mok et al.

(10) Patent No.: US 7,836,590 B2
(45) Date of Patent: Nov. 23, 2010

(54) MANUFACTURING METHOD FOR PRINTED CIRCUIT BOARD

(75) Inventors: Jee-Soo Mok, Yongin-si (KR);
Jun-Heyoung Park, Hwaseong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 91 days.

(21) Appl. No.: 12/068,124

(22) Filed: Feb. 1, 2008

(65) Prior Publication Data

US 2009/0013525 A1    Jan. 15, 2009

(30) Foreign Application Priority Data

Jul. 10, 2007    (KR) ...................... 10-2007-0069280

(51) Int. Cl.
*H01K 3/10* (2006.01)

(52) U.S. Cl. .............................. 29/852; 29/827; 29/829; 29/830; 29/831; 29/847; 174/261; 174/263; 174/265; 174/267; 216/13; 216/17; 216/18

(58) Field of Classification Search .................. 29/827, 29/829–831, 847, 852; 174/261, 263, 265, 174/267; 216/13, 14, 17–19
See application file for complete search history.

(56) References Cited

U.S. PATENT DOCUMENTS 4,960,489 A * 10/1990 Roeska et al. ............... 438/627
5,121,299 A *  6/1992 Frankeny et al. ............. 361/785
5,209,817 A *  5/1993 Ahmad et al. ................. 216/18
5,258,094 A * 11/1993 Furui et al. .................... 216/20
5,480,048 A *  1/1996 Kitamura et al. .............. 216/13
6,168,725 B1 *  1/2001 Achari et al. .................. 216/13
2002/0177006 A1 * 11/2002 Clothier et al. ............. 428/596

FOREIGN PATENT DOCUMENTS

JP    2004-140085    5/2004
JP    2005-38898     2/2005

OTHER PUBLICATIONS

Japanese Office Action dated Jun. 3, 2010 and issued in corresponding Japanese Patent Application 2008-067433.

* cited by examiner

*Primary Examiner*—Derris H Banks
*Assistant Examiner*—Jeffrey Carley

(57) ABSTRACT

A manufacturing method for a printed circuit board is disclosed. The method includes: forming a first circuit pattern on a metal layer of a conductive carrier, which has the metal layer stacked on one side, pressing the conductive carrier and a first insulation layer together with the first circuit pattern facing the first insulation layer, forming a via by selectively removing the conductive carrier, and removing the metal layer. Using this method, a high-density thin package can be manufactured with increased reliability, and the productivity of the manufacturing process can also be improved.

11 Claims, 37 Drawing Sheets

300

MANUFACTURING METHOD FOR PRINTED CIRCUIT BOARD

CROSS-REFERENCE TO RELATED APPLICATIONS

This application claims the benefit of Korean Patent Application No. 10-2007-0069280 filed with the Korean Intellectual Property Office on Jul. 10, 2007, the disclosure of which is incorporated herein by reference in its entirety.

BACKGROUND

1. Technical Field

The present invention relates to a manufacturing method for a printed circuit board.

2. Description of the Related Art

With developments in the electronics industry, the demand is rapidly increasing for electronic components that provide higher functionalities and smaller sizes. In step with such trends, the printed circuit board, in which the various electronic products are embedded, is also being given greater densities. Current printed circuit boards are being required not only to be stacked in multiple layers but also to have fine-lined circuit patterns. To improve productivity, there is also a need for a reduced manufacturing process.

FIGS. 1A to 1H are cross-sectional views representing a flow diagram of a method for manufacturing a printed circuit board according to the related art. In FIGS. 1A to 1H are illustrated a copper clad laminate 100, a via hole 102, plating layers 104, circuit patterns 106, insulation layers 108, a blind via hole 112, and outer circuit patterns 114.

As illustrated in FIGS. 1A to 1H, several processes may be used in the related art for manufacturing a multilayer printed circuit board. First, via holes 102 may be processed in a copper clad laminate 100, and the copper clad laminate 100 may be plated, after which the via hole 102 may be buried. Next, circuit patterns 106 may be formed on the outer surfaces of the copper clad laminate 100, and insulation layers 108 may be stacked on to form new levels, and blind via holes 112 may be processed on the exterior. The blind via holes 112 may be plated to provide electrical connection, and outer circuit patterns 114 may be formed on the outer surfaces of the outer insulation layers, to manufacture a multilayer printed circuit board.

However, the manufacturing method for a printed circuit board according to the related art may entail difficulties in forming and processing via holes, and the range to which fine-line circuit patterns can be fabricated may be dependent on the plating thickness, so that there is a limit to manufacturing a high-density printed circuit board with a high level of reliability.

SUMMARY

An aspect of the invention is to provide a manufacturing method for a printed circuit board, with which fine-lined patterns can be formed with high reliability, and which improves productivity.

One aspect of the invention provides a method of manufacturing a printed circuit board that includes: forming a first circuit pattern on a metal layer of a conductive carrier, which has the metal layer stacked on one side, pressing the conductive carrier and a first insulation layer together with the first circuit pattern facing the first insulation layer, forming a via by selectively removing the conductive carrier, and removing the metal layer.

Forming the via can include: forming an etching resist that is in correspondence with a position of the via, and applying an etchant, which corresponds with the conductive carrier, over the conductive carrier. The removing of the metal layer can include etching the metal layer by applying an etchant corresponding to the metal layer. Here, the conductive carrier and the metal layer can react to different etchants.

Forming the first circuit pattern may include: forming a plating resist, which corresponds with the first circuit pattern, over the metal layer, and performing electroplating using the metal layer as an electrode, where the metal layer can include nickel (Ni).

In certain embodiments, the method can further include forming a paste bump in a predetermined position on the first circuit pattern, and the pressing can be performed such that the paste bumps protrudes from the first insulation layer.

There can be a pair of conductive carriers used, where the pressing may be performed with the first insulation layer interposed between the pair of conductive carriers. The pair of conductive carriers can each be attached to either side of a dissimilar material.

In such cases, the forming of the first circuit pattern can include: forming a plating resist, which can be in correspondence with a first circuit pattern, on the metal layer of each of the pair of conductive carriers, and performing electroplating using the metal layers respectively as an electrode, while the method can further include separating the pair of conductive carriers after the forming of the first circuit patterns.

After the removing of the metal layer, the operations of pressing a second insulation layer on such that the via penetrates the second insulation layer, and forming a second circuit pattern on the second insulation layer, may additionally be included. Here, the second insulation layer can further include a conductive layer on the outer surface; and the pressing of the second insulation layer can be performed such that the via penetrates the second insulation layer and electrically couples with the conductive layer.

After forming the second circuit pattern, an operation may be included of pushing the second circuit pattern into the second insulation layer. Also, the forming of the second circuit pattern can include: forming a plating resist that corresponds with the second circuit pattern over the second insulation layer, and plating the second insulation layer.

Additional aspects and advantages of the present invention will be set forth in part in the description which follows, and in part will be obvious from the description, or may be learned by practice of the invention.

BRIEF DESCRIPTION OF THE DRAWINGS

FIG. 3A, FIG. 3B, FIG. 3C, FIG. 3D, FIG. 3E, FIG. 3F, FIG. 3G, FIG. 3H, FIG. 3I, FIG. 3J, FIG. 3K, FIG. 3L, FIG. 3M, FIG. 3N, and FIG. 3O are cross-sectional views representing a flow diagram of a method for manufacturing a printed circuit board according to an embodiment of the invention.

DETAILED DESCRIPTION

Figure 1A:
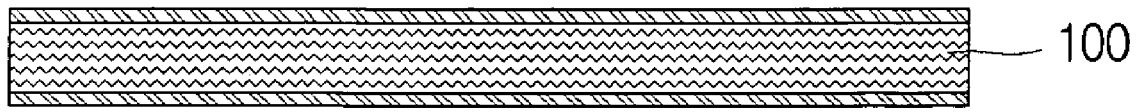
FIG. 1A, FIG. 1B, FIG. 1C, FIG. 1D, FIG. 1E, FIG. 1F, FIG. 1G, and FIG. 1H are cross-sectional views representing a flow diagram of a method for manufacturing a printed circuit board according to the related art.
Figure 1B:
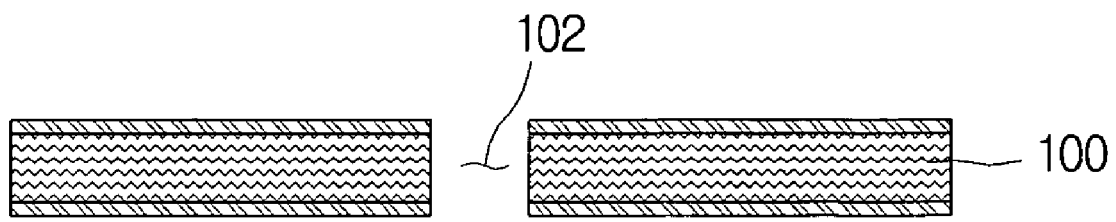
Figure 1C:
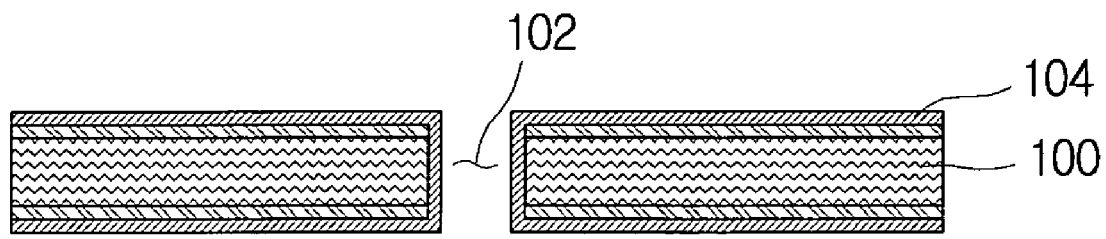
Figure 1D:
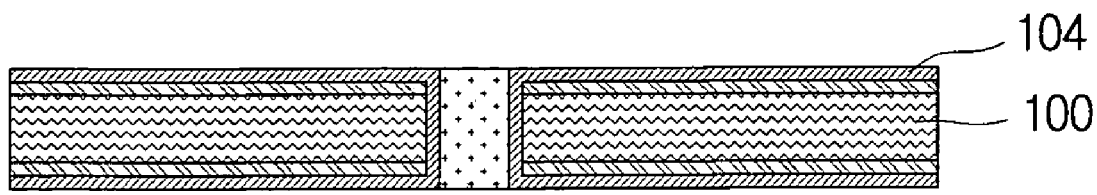
Figure 1E:
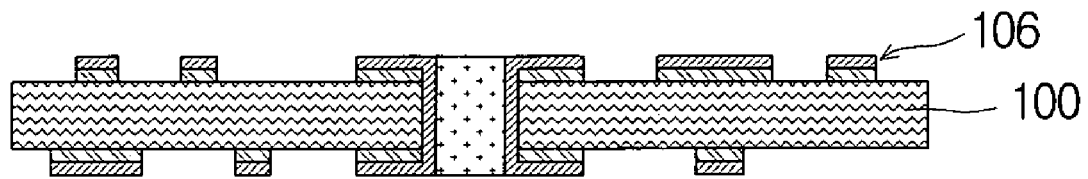
Figure 1F:
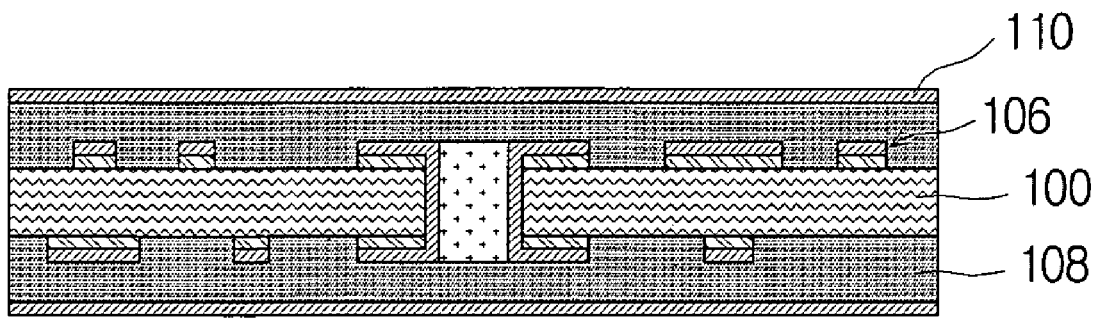
Figure 1G:
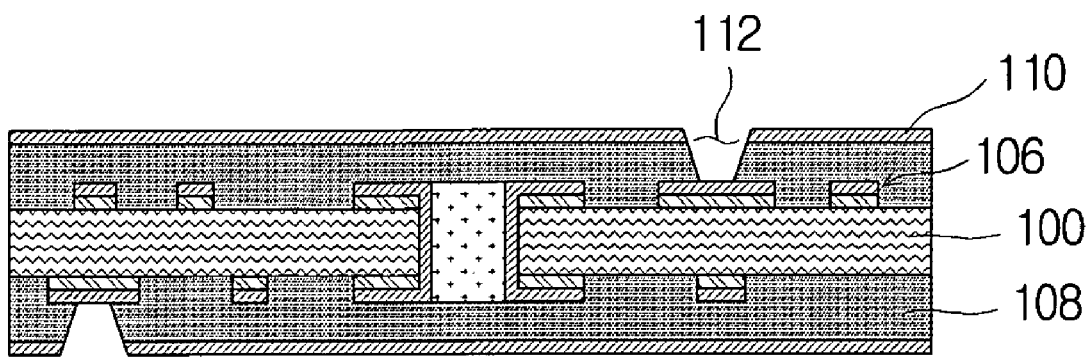
Figure 1H:
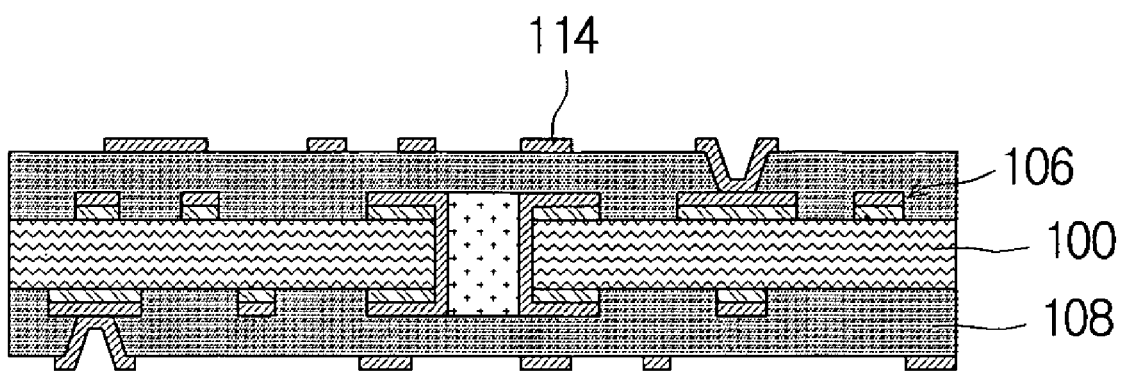

Certain embodiments of the invention will be described below in more detail with reference to the accompanying drawings. Those components that are the same or are in correspondence are rendered the same reference numeral regardless of the figure number, and redundant explanations are omitted.

Figure 2:
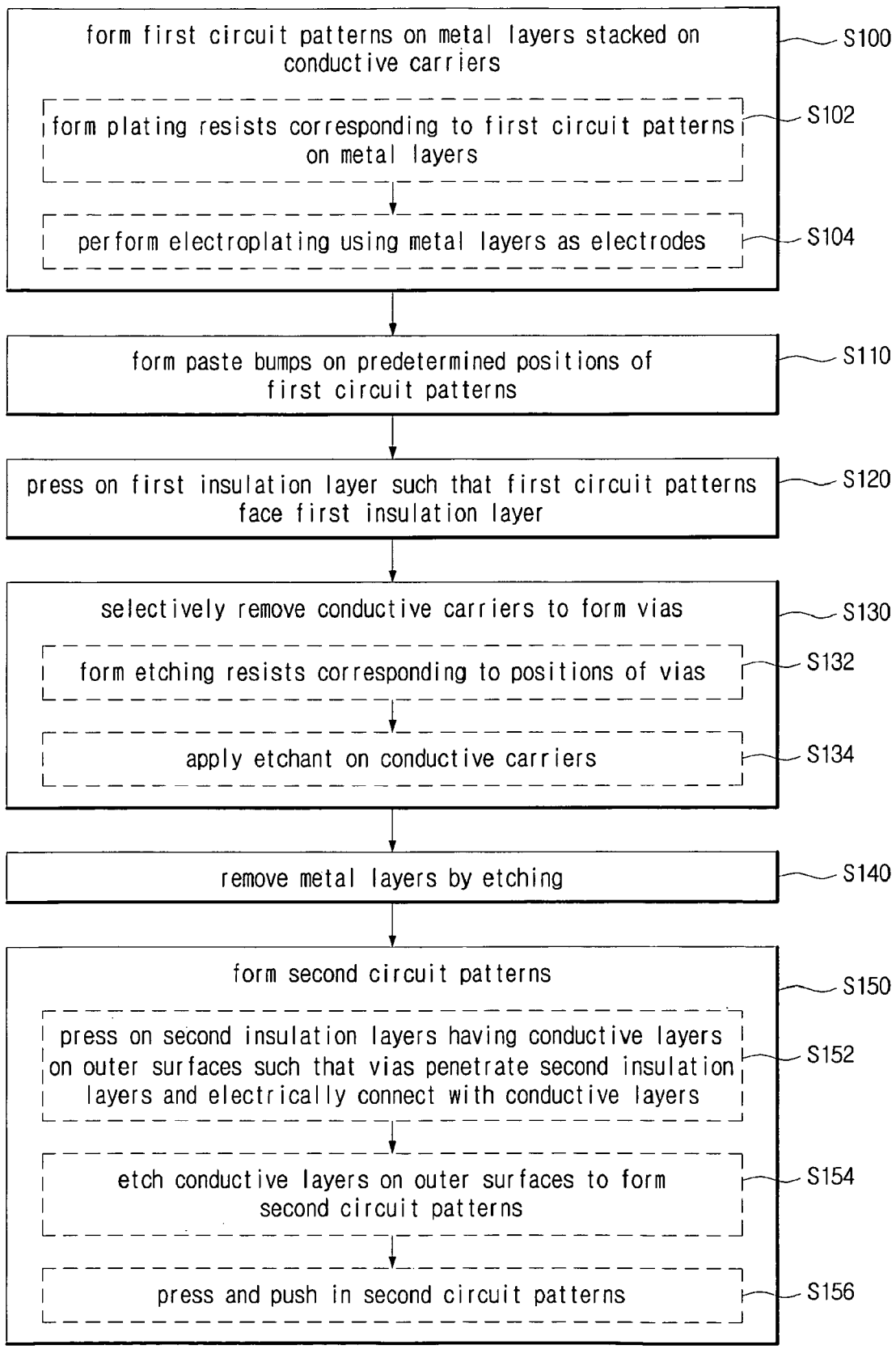
FIG. 2 is a flowchart illustrating a method for manufacturing a printed circuit board according to an embodiment of the invention.
Figure 3A:
Figure 3B:
Figure 3C:
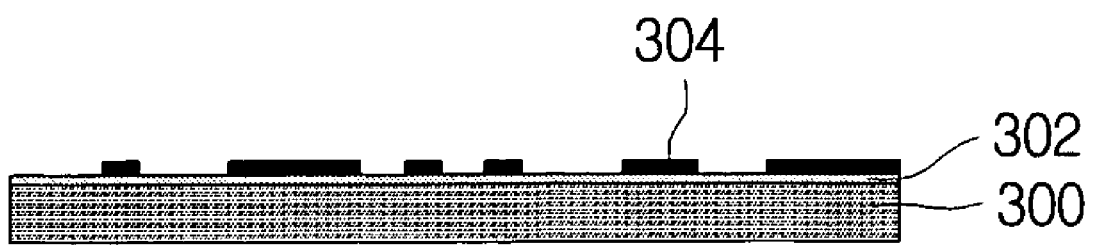
Figure 3D:
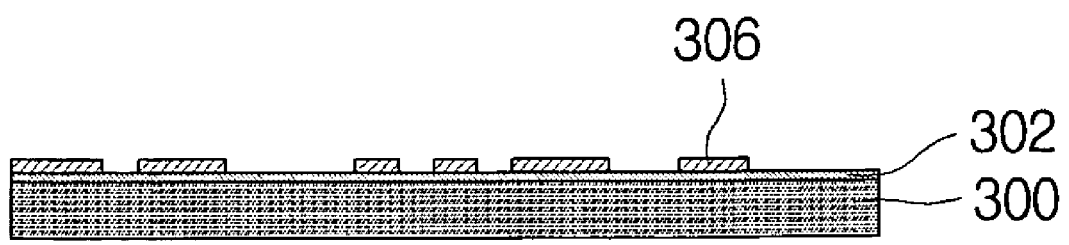

FIG. 2 is a flowchart illustrating a method for manufacturing a printed circuit board according to an embodiment of the invention, and FIGS. 3A to 3O are cross-sectional views representing a flow diagram of a method for manufacturing a printed circuit board according to an embodiment of the invention. In FIGS. 3A to 3O are illustrated conductive carriers 300, metal layers 302, photosensitive material 304, first circuit patterns 306, paste bumps 308, a first insulation layer 310, vias 312, second insulation layers 314, conductive layers 316, and second circuit patterns 317.

A manufacturing method for a printed circuit board according to this embodiment may include forming first circuit patterns 306 on metal layers 302 stacked on conductive carriers 300, pressing the conductive carriers and a first insulation layer 310 with the first circuit patterns 306 facing the first insulation layer 310, selectively removing the conductive carriers 300 to form vias 312, and removing the metal layers 302. Such a method for manufacturing a printed circuit board makes it possible to manufacture a high-density thin package with improved reliability, and to improve productivity in the manufacturing process.

First, the first circuit patterns 306 can be formed on the metal layers 302, for conductive carriers 300 each having a metal layer 302 stacked on one side (S100). The conductive carriers 300 can ultimately serve to provide electrical connection between layers in a multilayer printed circuit board. A conductive carrier 300 can be made from a material capable of providing electrical connection, such as copper (Cu). The metal layer 302 can serve to protect the first circuit pattern 306 when the conductive carriers 300 are etched to form vias 312, and thus can be made from a metal that reacts to a different etchant from that for the conductive carriers 300. In this particular embodiment, as the conductive carriers 300 are made of copper, the metal layers 302 can be made from a different material, such as nickel (Ni).

The conductive carriers 300 can be provided with metal layers 302 stacked beforehand on one side respectively, or can be fabricated during the manufacturing process. To stack the metal layer 302 on one side of the conductive carrier 300, a conductive carrier 300 may first be prepared. The metal layer 302 can be plated on to one side of the conductive carrier 300. In this particular embodiment, nickel is plated on to conductive carriers 300 made of copper. The plating can be performed by wet methods or by dry methods, including sputtering.

Next, to form the first circuit patterns 306, plating resists that are in correspondence with first circuit patterns 306 can be formed over the metal layers 302 (S102). A first circuit pattern 306 refers to a certain circuit pattern that is to be formed on the conductive carrier 300. The plating resists can be made of photosensitive material 304, e.g. dry film.

The forming of the plating resists can be followed by exposure and development processes. Then, electroplating can be performed using the metal layers 302 as electrodes (S104). Since the metal layers 302 are made of nickel in this particular embodiment, each nickel layer can be used as the electrode. A first circuit pattern 306 can be formed by electroplating the nickel layer. Methods of electroplating can include, for example, semi-additive type electroplating methods. The first circuit patterns 306 plated on using the nickel layers as electrodes have display improved adhesion, and as a result, fine-line patterns may be formed.

Figure 3E:
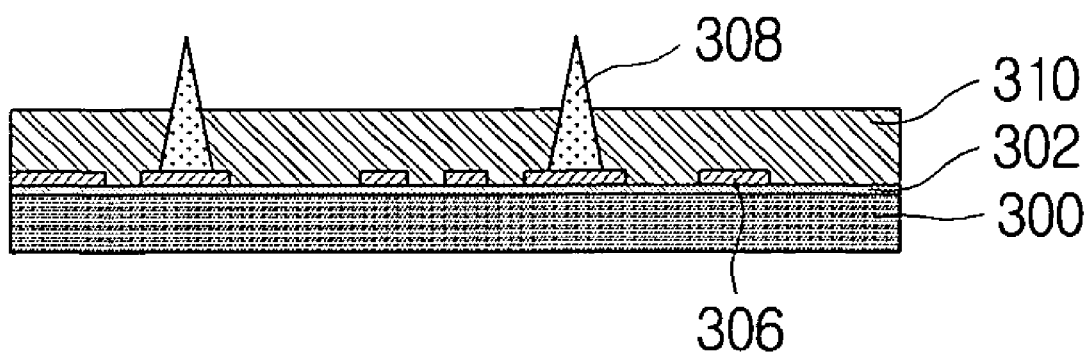
Figure 3F:
Figure 3G:
Figure 3H:
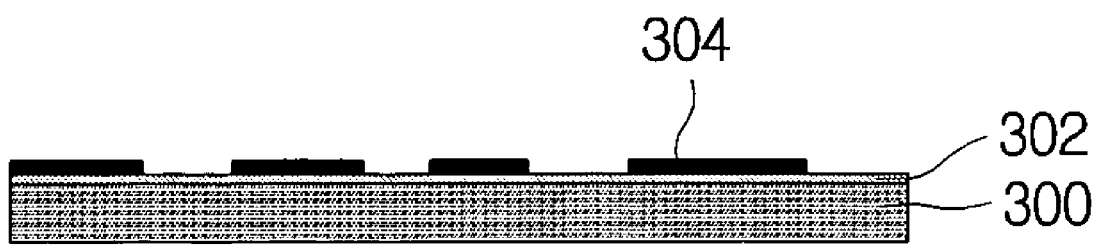
Figure 31:
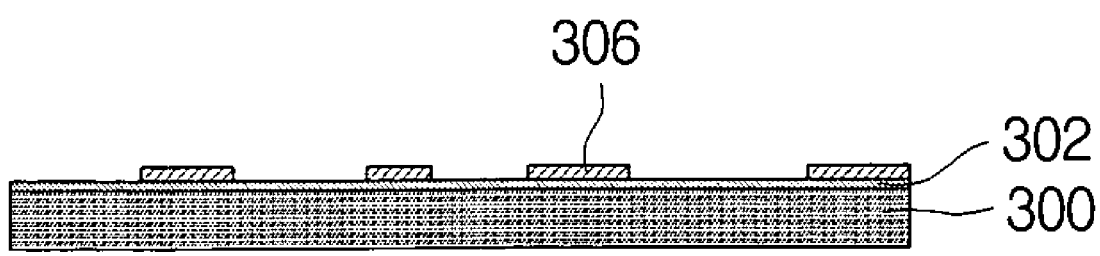
Figure 3J:
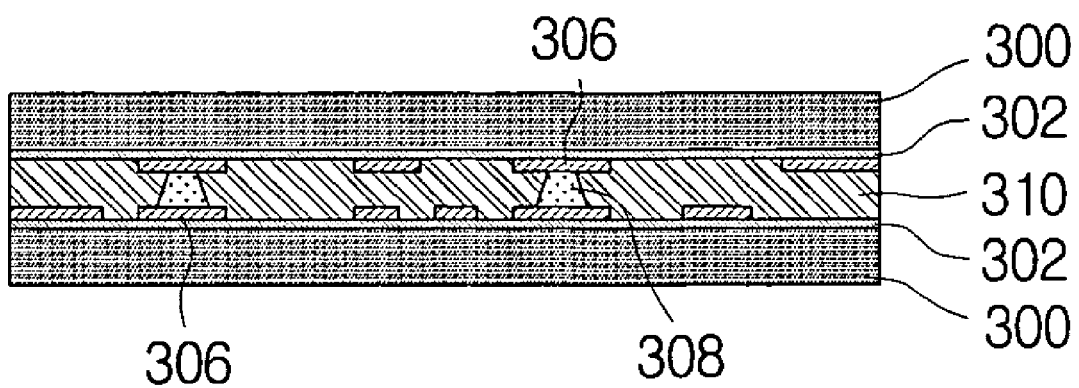

Next, paste bumps 308 can be formed in predetermined positions of the first circuit patterns 306 (S110). As illustrated in FIG. 3E, for the cases in which first circuit patterns 306 are formed on two conductive carriers 300, the paste bumps 308 may be formed on just one first circuit pattern 306. The paste bumps 308 may include silver paste. The "predetermined positions" may be positions where interlayer connectors are required in the design of the circuits.

After forming the paste bumps 308 on predetermined positions of a first circuit pattern 306, a first insulation layer 310 can be pressed on such that the first insulation layer 310 faces the first circuit pattern 306 (S120). As illustrated in FIG. 3E, the first insulation layer 310 can be pressed on to a conductive carrier on which the paste bumps 308 are formed, such that the paste bumps 308 protrude out.

Of course, the paste bumps 308 can be formed on the first circuit patterns 306 of two conductive carriers 300, in which case the two conductive carriers 300 on which the paste bumps 308 are formed can be pressed together at the same time, with the first insulation layer 310 interposed in-between.

Next, the conductive carriers 300 can be selectively removed to form vias 312 (S130). To form the vias 312, etching resists can first be formed in positions corresponding to the vias 312 (S132). The etching resists can, for example, be formed in positions where the vias 312 are to be formed according to the design. Next, an etchant that corresponds with the conductive carriers 300 can be applied to form the vias 312 (S134).

Figure 3K:
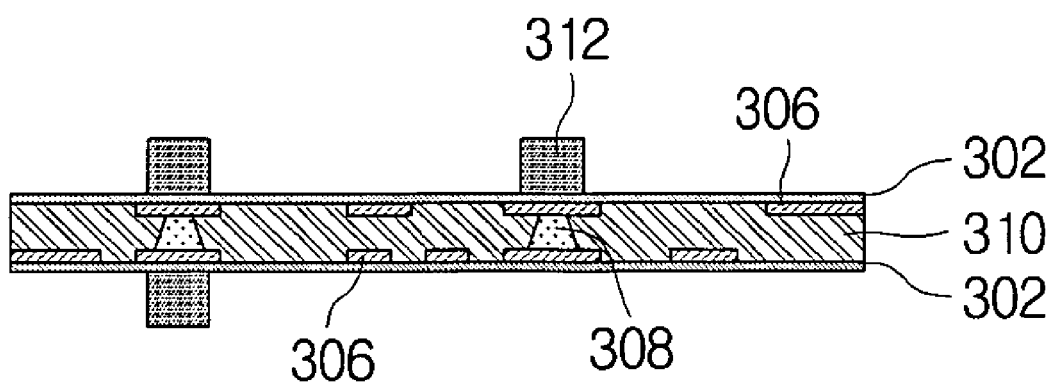
Figure 3L:
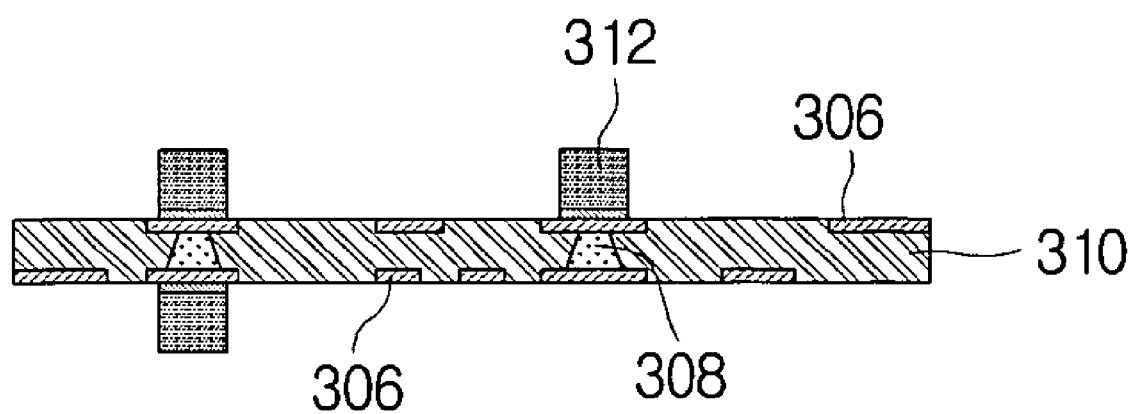
Figure 3M:
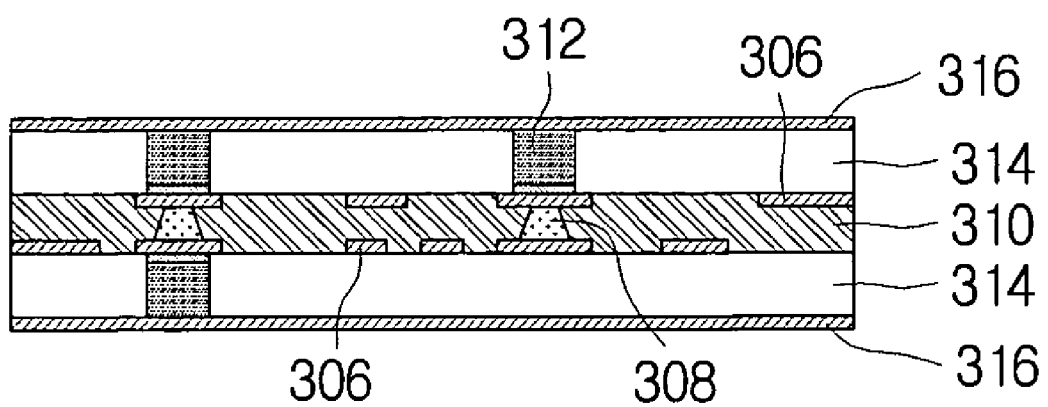
Figure 3N:
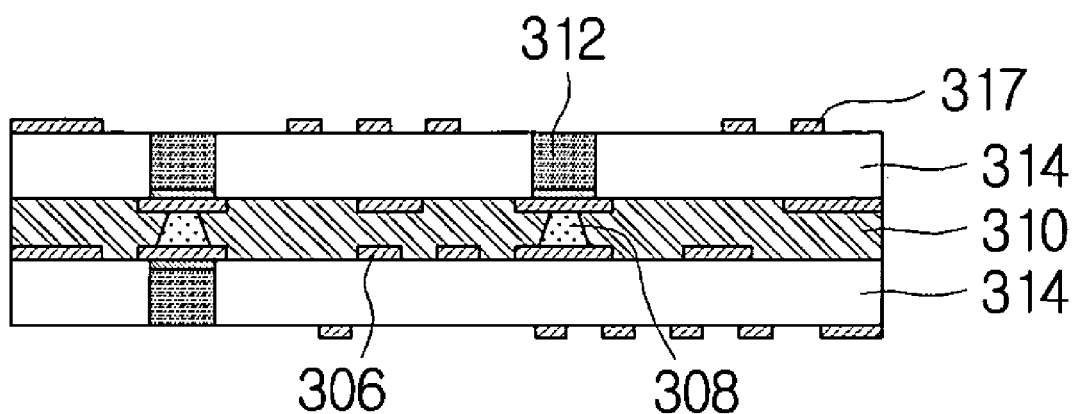
Figure 30:
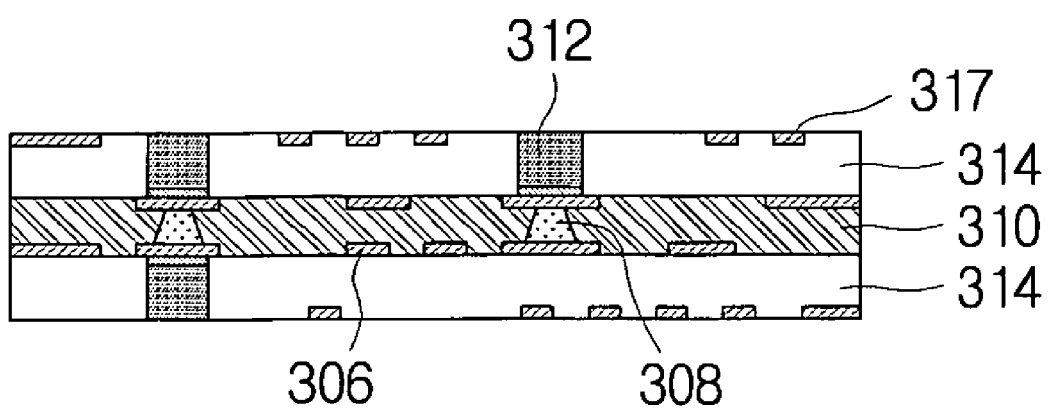

Here, the etchant can be an etchant capable of etching the conductive carriers 300. Since the conductive carriers 300 are made of copper in this particular embodiment, the etchant can be, for example, ferric chloride ($FeCl_3$), cupric chloride ($CuCl_2$), etc. As illustrated in FIG. 3K, the vias 312 can be formed as the conductive carriers 300 made of copper are etched. As the vias 312 for interlayer connection can be formed without processes such as drilling, the process can be simplified.

Next, a corresponding etchant can be applied to etch the metal layers 302 (S140). Here, the etchant can be that which is capable of etching the metal layers but incapable of etching the conductive carriers. As the metal layers 302 in this particular embodiment are described using nickel as an example, the etchant can be such that corrodes only nickel and does not corrode copper. In other words, the metal layers 302 and the conductive carriers 300 can react to different etchants. The etchant here can be, for example, nitric acid ($HNO_3$).

Next, second circuit patterns 317 can be formed (S150). Forming the second circuit patterns 317 can include pressing on second insulation layers 314 such that the vias 312 penetrate the second insulation layers 314, and forming the second circuit patterns 317 on the second insulation layers 314.

Here, the second insulation layers 314 may include conductive layers on the outer surfaces, and the pressing on of the second insulation layers 314 can have the vias 312 penetrate the second insulation layers 314 and electrically connect with the conductive layers. After forming the second circuit patterns 317, the second circuit patterns 317 can be pressed and pushed in.

Alternately, forming the second circuit patterns 317 can include, after pressing on the second insulation layers 314 such that the vias 312 penetrate the second insulation layers 314, forming plating resists corresponding to the second circuit pattern 317 over the second insulation layers 314 and plating the second insulation layers 314.

This particular embodiment is described with the second circuit patterns 317 formed by the former method. The latter method will be described later with reference to a subsequently disclosed embodiment.

To form the second circuit patterns 317, second insulation layers 314 that include conductive layers on the outer surfaces may first be pressed on, such that the vias 312 penetrate the second insulation layers 314 and electrically connect with the conductive layers (S152). The conductive layers may provide the portions forming the second circuit pattern 317, and can be made from such materials as copper, for example. The vias 312 may provide electrical connection between layers, and the pressing on of the second insulation layer 314 may be such that enables electrical connection between the conductive layers on the outer surfaces and the vias 312. The pressing can involve applying pressure on the printed circuit board using a press, etc.

Of course, the insulation layers may be stacked with the conductive layers formed beforehand on the outer surfaces, as in this particular embodiment, or the conductive layers may be pressed on to the outer surfaces after stacking the insulation layers such that the vias 312 penetrate the insulation layer.

Next, the conductive layers on the outer surfaces may be etched to form the second circuit patterns 317 (S154). Etching resists corresponding to the second circuit patterns 317 can be applied on the conductive layers, and then an etchant may be applied to selectively remove portions of the conductive layers and form the second circuit patterns 317.

Next, the second circuit patterns 317 may be pressed and pushed in (S156). By applying pressure on the second circuit patterns 317 to bury the second circuit patterns 317 in the second insulation layers 314, a sufficient amount of adhesion can be obtained for the second circuit patterns 317, and an ultra thin printed circuit board can be manufactured. The pushing in of the second circuit patterns 317 can be performed with heat applied in addition to applying pressure, according to the material used for the second insulation layers 314.

Figure 4:
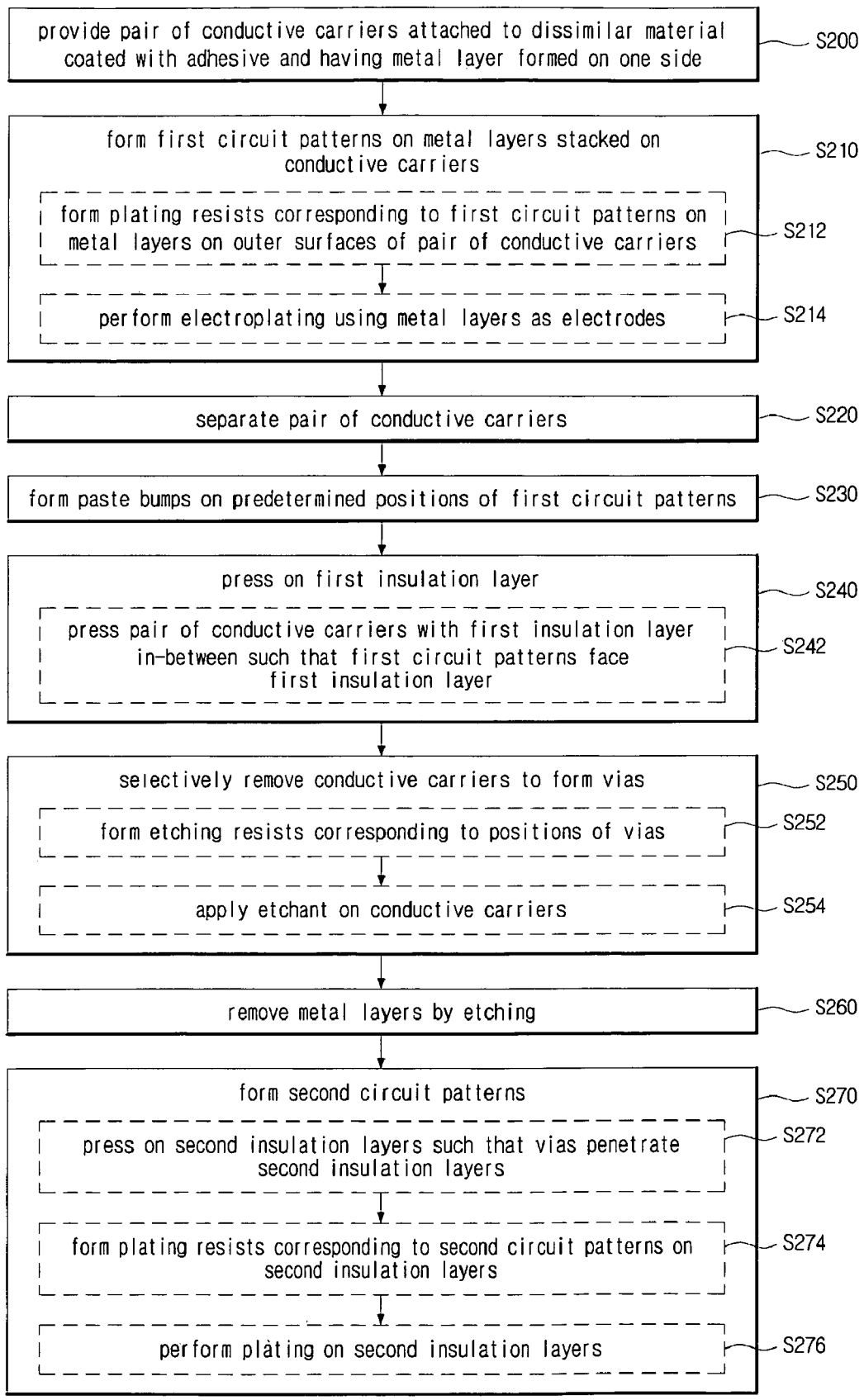
FIG. 4 is a flowchart illustrating a method for manufacturing a printed circuit board according to another embodiment of the invention.

FIG. 4 is a flowchart illustrating a method for manufacturing a printed circuit board according to another embodiment of the invention, and FIGS. 5A to 5L are cross-sectional views representing a flow diagram of a method for manufacturing a printed circuit board according to another embodiment of the invention. In FIGS. 5A to 5L are illustrated a dissimilar material 600, conductive carriers 300, metal layers 302, photosensitive material 602, first circuit patterns 306, paste bumps 308, a first insulation layer 310, vias 312, second insulation layers 314, and second circuit patterns 604.

In a method of manufacturing a printed circuit board according to this embodiment, a pair of conductive carriers 300, each attached to either side of a dissimilar material 600 coated with adhesive, may be used, so that the forming of the first circuit patterns 306 can be performed on both sides, for a simpler manufacturing process.

Figure 5A:
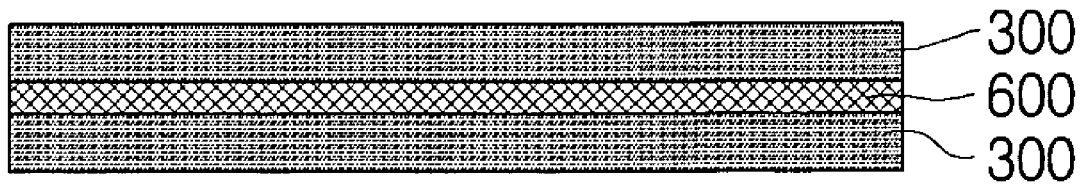
FIG. 5A, FIG. 5B, FIG. 5C, FIG. 5D, FIG. 5E, FIG. 5F, FIG. 5G, FIG. 5H, FIG. 5I, FIG. 5J, FIG. 5K, and FIG. 5L are cross-sectional views representing a flow diagram of a method for manufacturing a printed circuit board according to another embodiment of the invention.
Figure 5B:
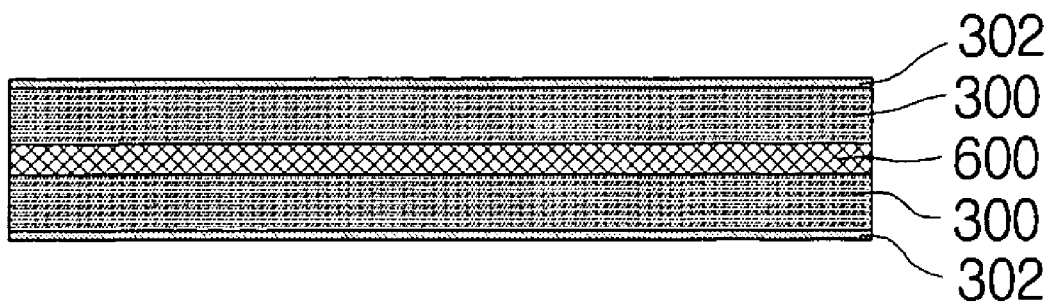
Figure 5C:
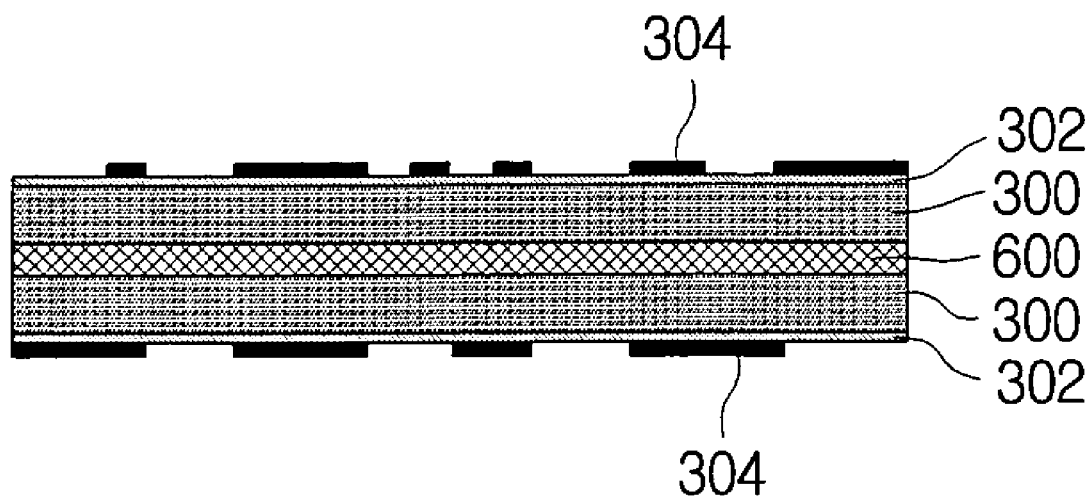
Figure 5D:
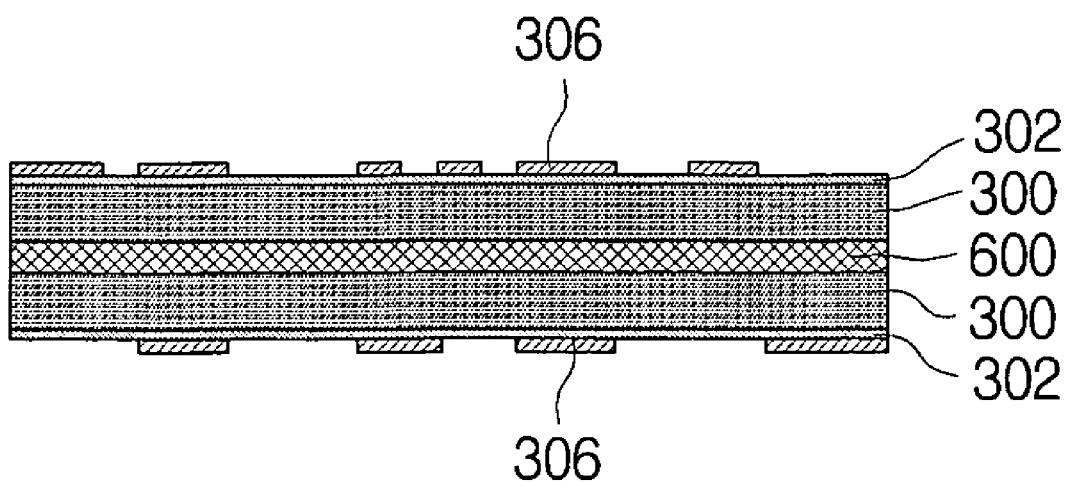
Figure 5E:
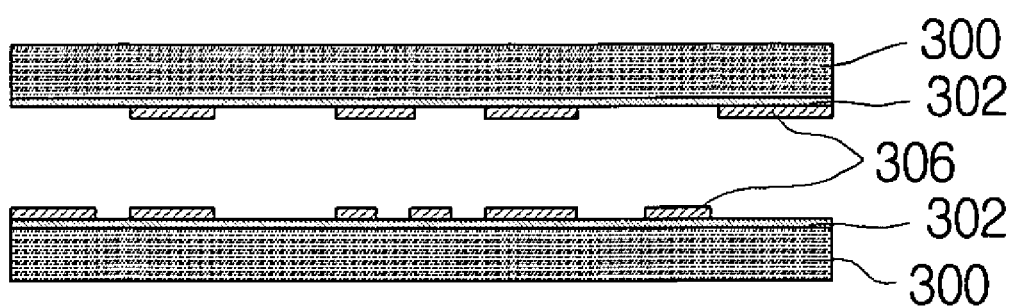

As illustrated in FIGS. 5A and 5B, a pair of conductive carriers 300 may be provided, each of which may have a metal layer 302 formed on one side and may be attached to either side of a dissimilar material 600 having adhesive applied thereto (S200). The dissimilar material 600 can be a material that allows the conductive carriers 300 to be readily separated in a subsequent process described later. Examples of such a material include foamable resins. If the dissimilar material 600 itself provides a sufficient level of adhesion, an adhesive may not need to be included.

While the pair of conductive carriers 300 can be provided already attached to the dissimilar material 600, they may be formed in the present process. For example, the arrangement can be formed by compressing the pair of conductive carriers 300 with the dissimilar material 600, to which adhesive is applied, positioned in-between.

The pair of conductive carriers 300 can each have a metal layer 302 stacked on one side. The pair of conductive carriers 300 having metal layers 302 stacked may each be attached to either side of the dissimilar material 600 coated with adhesive, or the metal layers 302 may be formed by plating on both sides after the conductive carriers 300 are pressed together.

Next, first circuit patterns 306 may be formed in the metal layers 302 stacked on the surfaces of the conductive carriers 300 (S210). To form the first circuit patterns 306, plating resists corresponding to the first circuit patterns 306 may first be formed over the metal layers 302 on the outer sides of the pair of conductive carriers 300 (S212).

A first circuit pattern 306 refers to the certain circuit pattern that is to be formed on the conductive carrier 300. The plating resist can be a photosensitive material 602, such as dry film, for example. The plating resist may be formed such that light may be transmitted to those portions other than where the first circuit patterns 306 are to be formed.

The forming of the plating resist can be followed by exposure and development processes. Then, electroplating may be formed, with the metal layers 302 serving as electrodes (S214). As nickel is used for the metal layers 302 in this particular embodiment, the nickel layers may serve as electrodes. By electroplating the nickel layers, the first circuit patterns 306 may be formed. The method for electroplating may include, for example, semi-additive methods. A first circuit pattern 306 plated on using the nickel layer as an electrode provides improved adhesion, and thus enables the forming of a fine-line pattern. As the process may be performed on both sides of the pair of conductive carriers 300, the manufacturing process can be simplified and expedited.

Next, the pair of conductive carriers 300 may be separated (S220). The method of separation may vary according to the properties of the dissimilar material 600. For example, the separation can involve applying a particular temperature which eliminates or drastically reduces the adhesion of the to the dissimilar material 600.

Figure 5F:
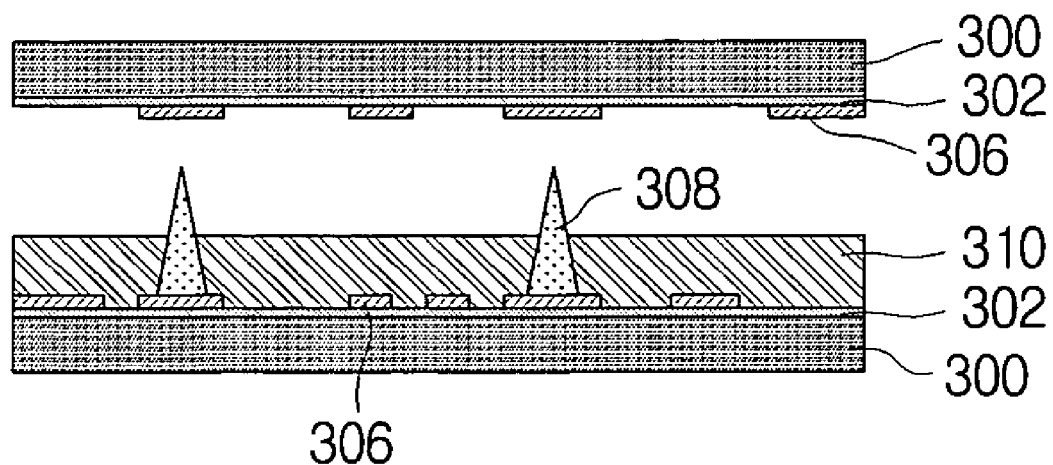

Then, paste bumps 308 may be formed in predetermined positions of the first circuit patterns 306 (S230). As illustrated in FIG. 5F, if there are first circuit patterns 306 formed on two conductive carriers 300, the paste bumps 308 can be formed on just one of the first circuit patterns 306. A paste bump 308 may include silver paste. A predetermined position may refer to a position where an interlayer connector is required in the design of the circuits.

Figure 5G:
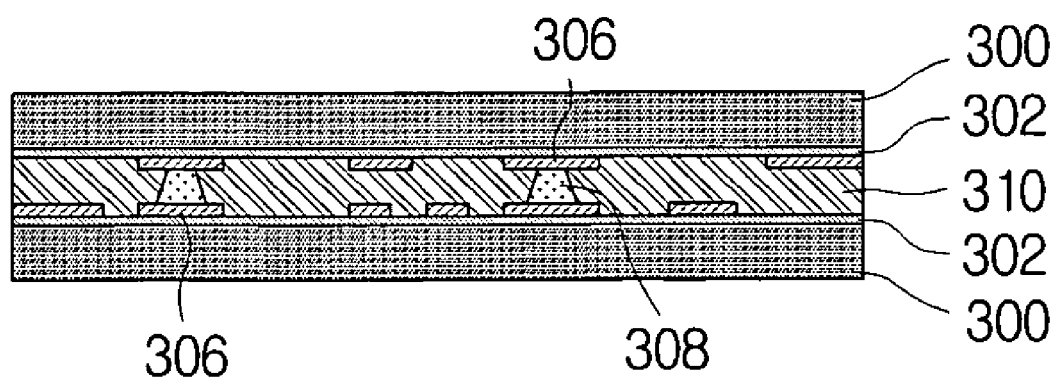

Next, a first insulation layer 310 may be pressed on (S240). After forming the paste bumps 308 on predetermined positions of the first circuit patterns 306, the first insulation layer 310 may be pressed on between the pair of conductive carriers 300 such that the first circuit patterns 306 face the first insulation layer 310 (S242). As illustrated in FIGS. 5F and 5G, the first insulation layer 310 may be pressed on to a conductive carrier 300 on which paste bumps 308 are formed, such that the paste bumps 308 protrude out.

In certain embodiments, the paste bumps 308 can be formed on the first circuit patterns 306 of two conductive carriers 300, in which case the two conductive carriers 300 on which the paste bumps 308 are formed may be pressed together at the same time with the first insulation layer 310 interposed between.

Next, the conductive carriers 300 may be selectively removed to form vias 312 (S250). To form the vias 312, etching resists can first be formed in positions corresponding to the vias 312 (S252). The etching resists can be formed, for example, in positions where the vias 312 are to be formed according to the design. Then, an etchant that corresponds with the conductive carriers 300 can be applied to-form the vias 312 (S254).

Figure 5H:
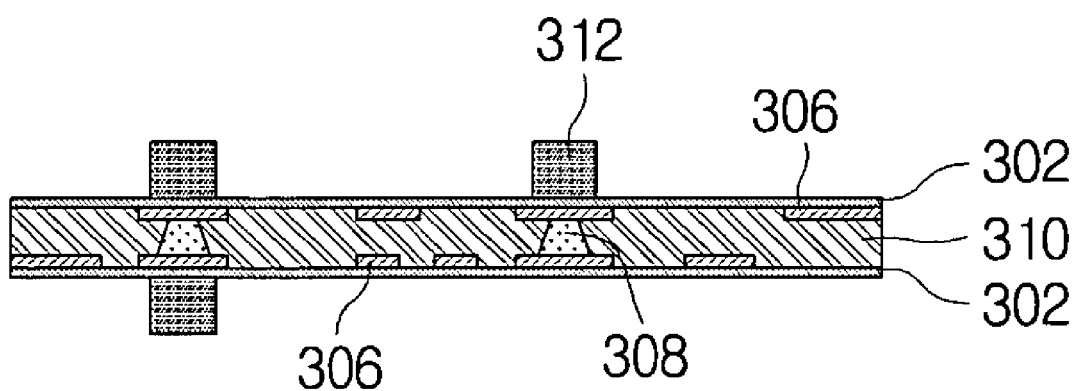
Figure 5I:
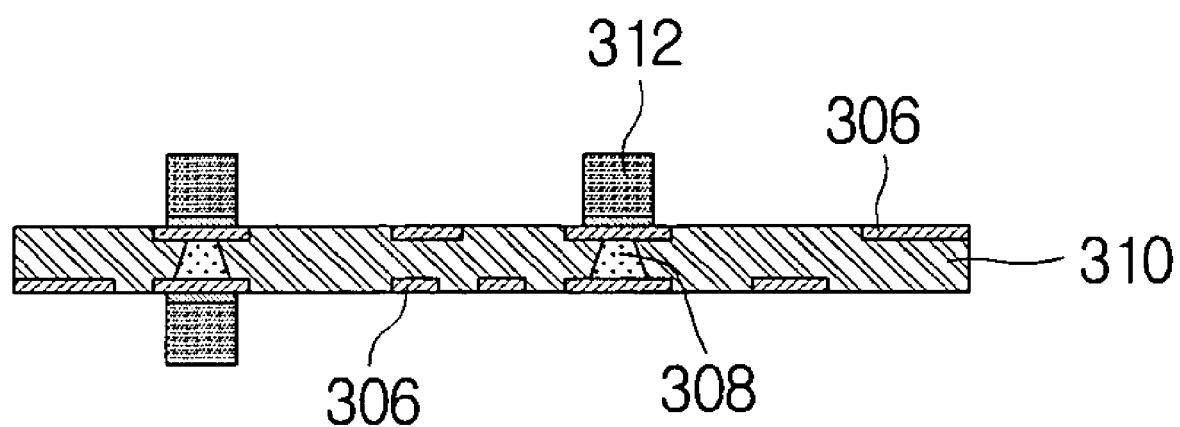
Figure 5J:
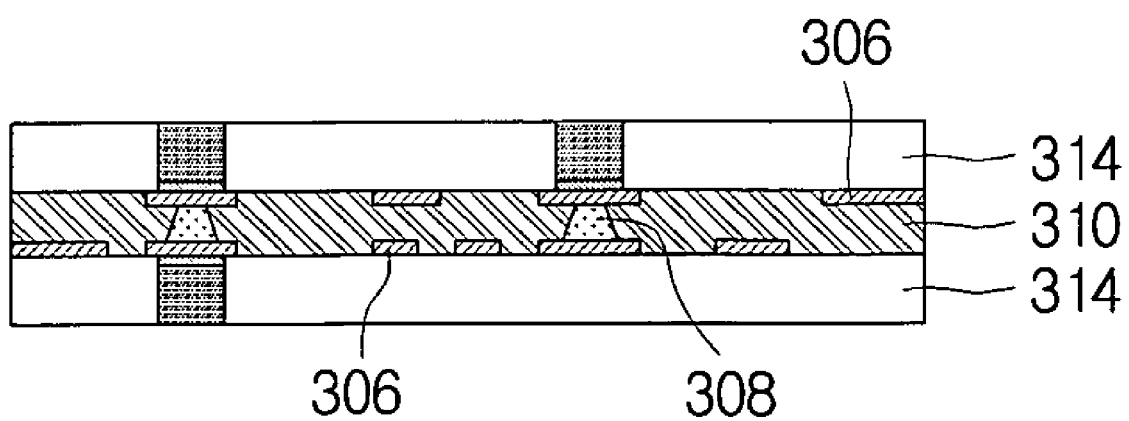
Figure 5K:
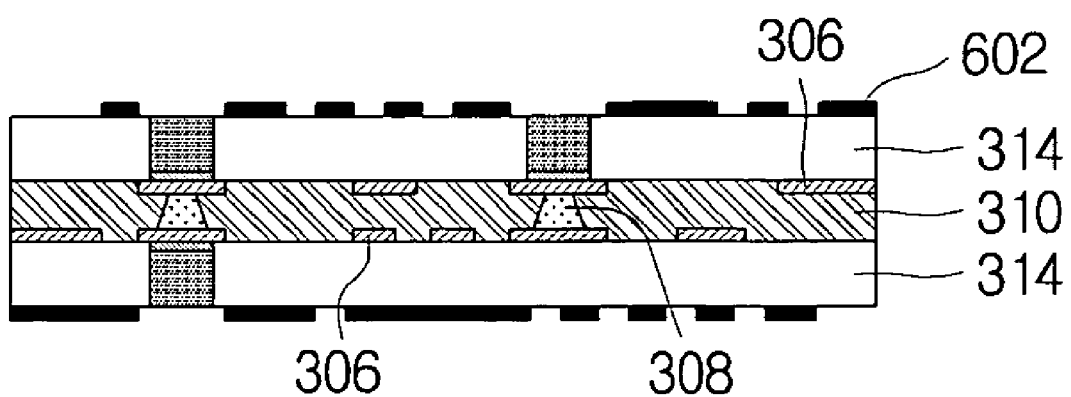
Figure 5L:
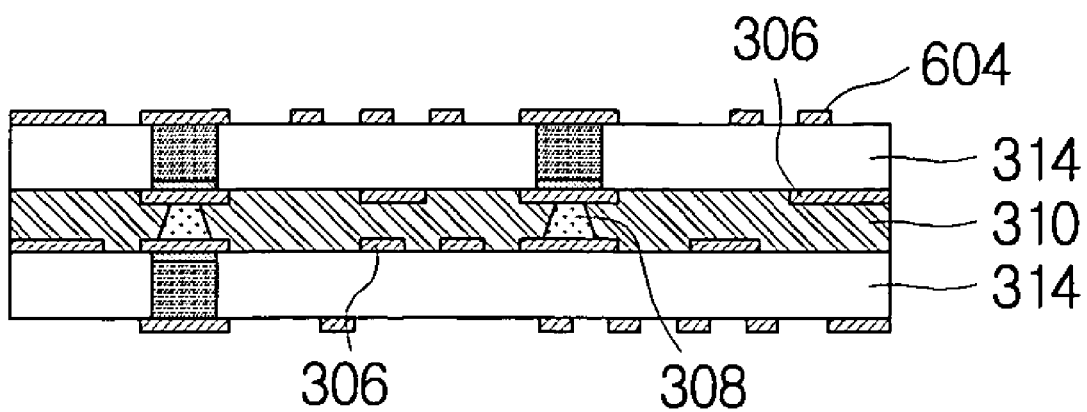

In this particular embodiment, since the conductive carriers 300 are made of copper, the etchant can be, for example, ferric chloride ($FeCl_3$), cupric chloride ($CuCl_2$), etc. As illustrated in FIG. 5H, the vias 312 can be formed by etching the conductive carriers 300 made of copper. As the vias 312 for interlayer connection can be formed without processes such as drilling, the process can be simplified.

Next, the metal layers 302 may be etched and removed (S260). As the metal layers 302 in this embodiment are described using nickel as an example, the etchant can be such that corrodes only nickel and does not corrode copper. In other words, the metal layers 302 and the conductive carriers 300 can react to different etchants. The etchant can be, for example, nitric acid ($HNO_3$).

Next, second circuit patterns 604 can be formed (S270). In this embodiment, the forming of the second circuit patterns 604 will be described for the latter of the two methods mentioned above. To form the second circuit patterns 604, second insulation layers 314 may be pressed on such that the vias 312 penetrate the second insulation layers 314 (S272).

The substrate layer, on which the vias 312 are formed, may be interposed between second insulation layers 314, which may be pressed together and stacked such that the vias 312 penetrate the second insulation layers 314. The second insulation layer 314 may be pressed such that the vias 312 penetrate the second insulation layer 314, because the vias 312 will provide electrical connection between second circuit patterns 604 formed over the second insulation layers 314. Then, plating resists may be formed on the second insulation layers 314 that correspond with the second circuit patterns 604 (S274).

The plating resists can be of a photosensitive material 602, such as dry film, for example. After forming the plating resist, exposure and development processes may be performed, and then the second insulation layers 314 may be plated (S276). The plating can be performed using a semi-additive method, for example. In cases where a semi-additive method is used for plating the second insulation layers 314, fine-line circuit patterns can be formed using, for example, ABF (Ajimoto build-up film) for the second insulation layers 314.

By using certain embodiments of the invention as set forth above, a high-density thin package can be manufactured with increased reliability, and the productivity of the manufacturing process can also be improved.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board, the method comprising:

forming a first circuit pattern on a metal layer of a conductive carrier, the conductive carrier having the metal layer stacked on one side thereof;

pressing the conductive carrier and a first insulation layer together such that the first circuit pattern faces the first insulation layer;

removing a portion of the conductive carrier such that a remaining portion of the conductive carrier becomes a via;

removing an exposed portion of the metal layer on the first insulation layer;

pressing a second insulation layer toward the first insulation layer such that the via penetrates the second insulation layer; and forming a second circuit pattern on the second insulation layer.

2. The method of claim 1, wherein the forming of the via comprises:

forming an etching resist, the etching resist being in correspondence with a position of the via; and applying an etchant on the conductive carrier, the etchant being in correspondence with the conductive carrier.

3. The method of claim 2, wherein the removing of the metal layer comprises:

etching the metal layer by applying an etchant corresponding to the metal layer.

4. The method of claim 3, wherein the conductive carrier and the metal layer react to different etchants.

5. The method of claim 1, wherein the forming of the first circuit pattern comprises:

forming a plating resist on the metal layer, the plating resist being in correspondence with the first circuit pattern; and performing electroplating using the metal layer as an electrode.

6. The method of claim 5, wherein the metal layer contains nickel (Ni).

7. The method of claim 1, further comprising:

forming at least one paste bump in a predetermined position of the first circuit pattern, wherein the pressing is performed such that the paste bump protrudes from the first insulation layer.

8. The method of claim 7, wherein the conductive carrier is formed in a pair, and wherein the pressing is performed with the first insulation layer interposed between the pair of conductive carriers.

9. The method of claim 8, wherein the pair of conductive carriers are each attached to either side of a dissimilar material, the forming of the first circuit pattern comprises:

forming a plating resist on the metal layer of each of the pair of conductive carriers, the plating resist being in correspondence with a first circuit pattern; and performing electroplating using the metal layers respectively as an electrode, and wherein the method further comprises, after the forming of the first circuit patterns:

separating the pair of conductive carriers.

10. The method of claim 1, wherein the second insulation layer further includes a conductive layer on an outer surface thereof,
the pressing of the second insulation layer is performed such that the via penetrates the second insulation layer to electrically couple with the conductive layer,
and wherein the method further comprises, after the forming of the second circuit pattern:
pushing the second circuit pattern into the second insulation layer.

11. The method of claim 1, wherein the forming of the second circuit pattern comprises:
forming a plating resist on the second insulation layer, the plating resist being in correspondence with the second circuit pattern; and
plating the second insulation layer.

* * * * *